United States Patent [19]

Davis et al.

[11] 4,131,928
[45] Dec. 26, 1978

[54] VOLTAGE CLAMP DEVICE FOR MONOLITHIC CIRCUITS

[75] Inventors: William F. Davis; Marc T. Stein, both of Tempe, Ariz.

[73] Assignee: Motorola, Inc., Schaumburg, Ill.

[21] Appl. No.: 809,600

[22] Filed: Jun. 24, 1977

[51] Int. Cl.$^2$ .................................................. H02H 3/22
[52] U.S. Cl. ....................................... 361/56; 307/303; 361/91
[58] Field of Search ............................. 361/56, 90, 91; 307/302, 303

[56] References Cited

U.S. PATENT DOCUMENTS

| 3,515,945 | 6/1970 | Bohm ....................................... 361/91 |
| 3,601,625 | 8/1971 | Redwine et al. ..................... 307/303 X |
| 4,005,342 | 1/1977 | Davis .................................... 361/56 X |

FOREIGN PATENT DOCUMENTS

2002683  9/1970  Fed. Rep. of Germany ............. 361/56

Primary Examiner—Harry E. Moose, Jr.
Attorney, Agent, or Firm—Michael D. Bingham

[57] ABSTRACT

A method and circuit are disclosed for providing input voltage transient signal protection to integrated circuits. The circuit comprises two NPN transistors fabricated integrally with the integrated circuit. The emitter of the first one of the transistors is adapted to be connected to an input of the integrated circuit. The N-epi collector regions of both transistors are connected, as is the emitter of the second transistor, to the P-substrate of the integrated circuit. The bases of the two transistors are connected together.

5 Claims, 6 Drawing Figures

VOLTAGE CLAMP DEVICE FOR MONOLITHIC CIRCUITS

BACKGROUND OF THE INVENTION

This invention relates to voltage clamping circuits, and more particularly to a circuit and method for providing symmetrical voltage clamping to an input signal to an integrated circuit (IC) without producing undesirable parasitic currents.

In the past, an IC was protected from large positive and negative voltage input signals by connecting the input of the IC in series with a limiting resistor in parallel with a zener diode. The co-inventor of the present invention, William Davis, has described significant problems associated with this technique in an article titled, "Bipolar Design Considerations for the Automotive Environment," *IEEE Journal of Solid State Circuits*, December, 1973, pp. 419–426. An example of such a problem occurs in response to large positive input signals which can cause significant power dissapation in the zener diode which is undesirous. An even worse condition may occur due to large negative input voltage transients.

Negative voltage transients, applied to any N-epi region with sufficient magnitude to forward bias the N-epi/P-substrate can seriously degrade functional IC performance due to the injection of electrons into the substrate (substrate injection). These minority charge carrier electrons will diffuse throughout the P-substrate region until they recombine or are collected by other reversed biased N-epi regions. As described in the above reference article, undesirous currents are established by the formation of a parasitic lateral NPN transistor which may be defined. Hence, circuit malfunction could result due to the parasitic collection of substrate injected electrons. Standard clamping techniques such as a zener diode clamp or even the conventional forward biased IC diode cannot be used as clamping devices for negative transients since substrate injection will occur as prescribed.

Thus, a need exists for symmetrically clamping the input voltage signal to the IC within a particular magnitude without producing the substrate injection of electrons.

SUMMARY OF THE INVENTION

Accordingly, it is an object of the present invention to provide a voltage clamp circuit and method for limiting an alternating input signal applied thereacross to predetermined values to protect monolithic integrated circuits including the clamp circuit without producing detrimental currents.

In accordance with the foregoing there is provided a voltage clamp circuit for use in monolithic currents which symmetrically clamps an applied input signal between particular magnitudes. The voltage clamp circuit comprises a first and a second electron control device having first, second and control electrodes, respectively. The first electrode of the first electron control device is adapted to be connected to an input terminal of the monolithic circuit, the second electrode thereof is coupled to the substrate of the monolithic circuit by the first and second electrodes of the second electron control device. The control electrodes of the first and second electron devices are also interconnected. This structure clamps the magnitude of an applied input voltage to the input terminal between a particular value as well as preventing deleterious effects of substrate injection.

DETAILED DESCRIPTION OF THE PREFERRED EMBODIMENT

Figure 1:
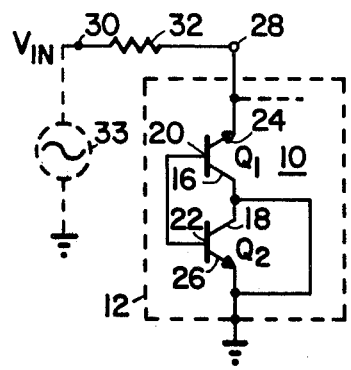
FIG. 1 illustrates the circuit of the present invention in schematic diagram form.
Figure 2:
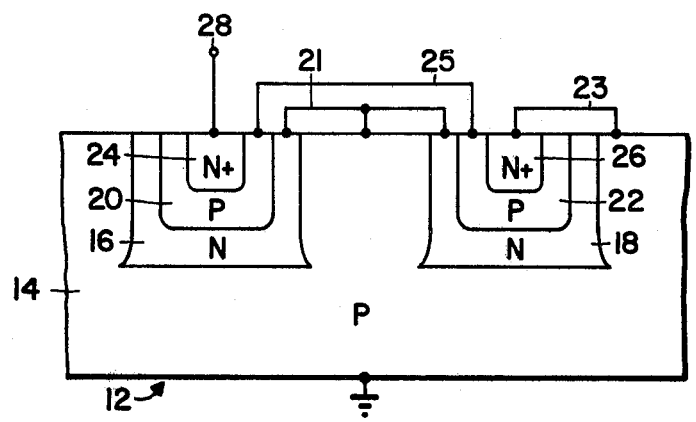
FIG. 2 is a cross section of a monolithic integrated circuit showing the formation of the present invention disposed therein.

Referring to FIGS. 1 and 2, there is shown voltage clamp circuit 10 which is suitable for clamping the magnitude of a voltage applied thereacross, e.g., to approximately ±7.8 volts. Voltage clamp circuit 10 is suitable to be fabricated as a part of integrated circuit (IC) 12 (shown in dashed outline) which may include other circuitry disposed therein (not shown) such as amplifiers, oscillators and etc. coupled to terminal 28. Voltage clamp circuit 10 comprises transistors Q1 and Q2 which are fabricated using known monolithic techniques during fabrication of IC-12. Transistors Q1 and Q2 may be bipolar NPN devices.

As illustrated in FIG. 2, IC-12 consists of a P-type substrate 14 into which N-type epi-regions or islands 16 and 18 are fabricated to form the collectors of transistors Q1 and Q2, respectively. Using standard photoetching and diffusion techniques, transistors Q1 and Q2 are completed with base P-type regions 20 and 22 and N+-type regions 24 and 26, respectively. It is to be understood that IC-12 may include other transistors and devices formed in a like manner as transistors $Q_1$ and $Q_2$. Again, using standard metallization pattern techniques, the emitter electrode or region 24 is connected to input terminal 28 of the IC. Collector regions 16 and 18 of transistors Q1 and Q2 are interconnected by a metal layer 21 (shown schematically) to each other and to P-type substrate 14 which, in a preferred embodiment, is connected to a ground reference potential. Similarly, emitter region 26 of Q2 is also connected to substrate 14 through a metallization connection illustrated as reference numeral 23. Clamp circuit 10 is completed by interconnecting base electrodes 20 and 22 of the transistors, via lead 25. It is to be understood that voltage clamp circuit 10, by clamping the magnitude of a voltage signal supplied across the IC between terminal 28 and ground reference, limits the maximum possible voltage swing which can be developed across the other circuits comprising IC-12. Thus, protection is provided to the IC from otherwise large voltage input transients which may occur at terminal 30 and be applied to terminal 28 via resistor 32. For instance, as shown outlined in phantom, an alternating voltage signal is supplied to terminal 30 from source generator 33. Source 33 may, for example, be an input signal from an alternator in an automobile ignition system or any other source and IC-12 could be a zero voltage switch which is utilized to determine when the applied signal from source 33 crosses the zero axis.

Figure 3A:
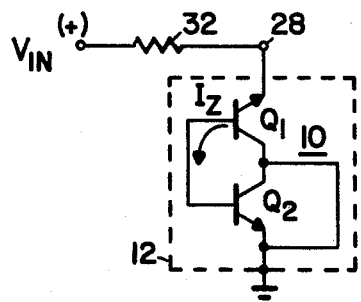
FIG. 3A illustrates the circuit of FIG. 1 with a positive voltage input signal applied thereto.
Figure 3B:
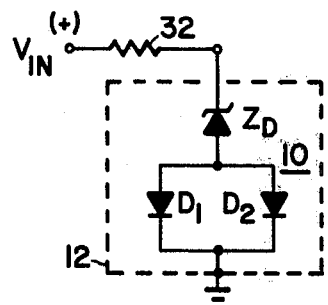
FIG. 3B illustrates the equivalent circuit of the circuit of FIG. 3A.

Referring to the remaining Figures, the operation of voltage clamp circuit 10 can be explained as the input voltage, $V_{IN}$, varies from a positive to a negative value. Specifically, referring to FIGS. 3A and 3B there is shown voltage clamp circuit 10 with a positive input voltage applied at terminal 30. As the voltage at terminal 30 exceeds the reverse breakdown voltage of the base-emitter junction of transistor Q1 zenering action is established and a zener current, $I_Z$, flows out of the base of transistor $Q_1$. The resultant circuit is shown in FIG. 3B wherein the base-emitter junction of transistor Q1 is shown as zener diode, $Z_D$. Diode, $D_1$ is formed by the emitter-base junction of transistor Q2 with diode $D_2$ being formed by the parallel combination of the collector-base junctions of transistors Q1 and Q2, respectively. Hence, the voltage developed between terminal 28 and ground reference is equal to the zener breakdown voltage of $Z_D$, which in the preferred embodiment may be 7 volts, plus the base-to-emitter junction voltages of diodes $D_1$ and $D_2$ which for silicon is equal to approximately 0.8 volts. Therefore, the magnitude of voltage which can be developed at the input to the IC is limited or clamped to approximately +7.8 volts. Under this condition no $N_{epi}$ region is forced negative.

Figure 4A:
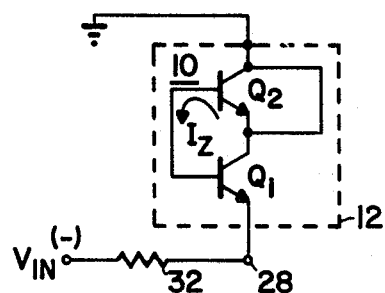
FIG. 4A illustrates the circuit of FIG. 1 with a negative input voltage applied thereto.
Figure 4B:
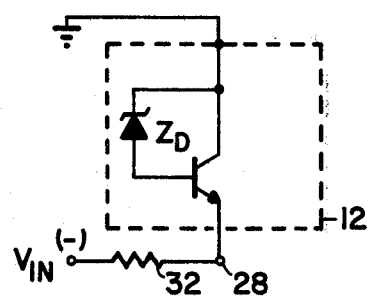
FIG. 4B illustrates the equivalent circuit of the circuit of FIG. 4A.

For negative voltage clamp conditions, as illustrated in FIGS. 4A and 4B, in response to the applied voltage $V_{IN}$ reaching a value which causes the voltage applied across voltage clamp circuit 10 to be greater than or equal to the zener breakdown voltage of the emitter-to-base junction of transistor Q2, zener current $I_Z$ flows therethrough to the base of transistor Q1 which acts as a normal active transistor. Hence, the voltage is limited to approximately a −7.8 volts. Notice again no $N_{epi}$ region is forced negative.

What has been described above, is a novel voltage clamp circuit comprising two interconnected transistor devices for symmetrically clamping the input voltage to an integrated circuit to ±7.8 volts approximately. The unique structure prevents the collector-epi regions that normally form the collectors of bipolar transistors of an integrated circuit from being forward biased; substrate injection is therefore prevented. Thus, stray currents which may have a deleterious effect on the function of the system are eliminated. The unique voltage clamp circuit described above does not force any epi-island region to go below ground reference potential and thus prevents substrate injection of electrons.

As an aside, it should be noted that since the base and collectors of transistors Q1 and Q2 are common, they can be built as a single multi-emitter NPN in a single epi-island.

What is claimed is:

1. A voltage clamp circuit suitable to be integrally fabricated in a monolithic integrated circuit for providing overvoltage protection to the integrated circuit, comprising:

first electron control means having first, second and control electrodes, said first electron control means being responsive to the magnitude of an alternating signal which is applied to an input of the integrated circuit reaching a first predetermined value for establishing a substantially constant voltage between said first and control electrodes thereof;

circuit means for coupling said first electrode of said first electron control means to the input of the integrated circuit; and second electron control means having first, second and control electrodes, said second electron control means being responsive to the magnitude of the alternating signal reaching a second predetermined value for establishing a substantially constant voltage between the first and control electrodes thereof, said first electrode of said second electron control means being connected to the substrate region of the integrated circuit, said second electrode of said second electron control means being connected to said second electrode of said first electron control means and to said substrate region, said control electrode of said second electron control means being connected to said control electrode of said first electron control means.

2. The voltage clamp circuit of claim 1 wherein said first and second electron control means are NPN transistors.

3. In a monolithic integrated circuit having a substrate region of a first semiconductor conductive type, a voltage clamp circuit comprising:

a first electron control device having,
 a. a first epi-region of a second semiconductor conductivity type disposed in the substrate region,
 b. a second region of said first conductivity type disposed in said first epi-region, and
 c. a third region of said second semiconductor conductivity type disposed in said second region, said third region being electrically coupled to an input terminal of the integrated circuit; and a second electron control device having,
 a. a first epi-region of said second conductivity type disposed in the substrate region and being electrically connected to said first epi-region of said first electron control device,
 b. a second region of said first conductivity type disposed in said first epi-region of said second electron control device, and
 c. a third region of said second conductivity type disposed in said second region of said second electron control device, said third region and respective first epi-regions of said first and second electron control devices being electrically connected to the substrate region.

4. In a system utilizing at least one monolithic integrated circuit which is responsive to an alternating signal being applied thereto, a voltage clamp circuit for providing over-voltage protection to the integrated circuit and for preventing substrate injection of electrons within the integrated circuit comprising:

first electron control means disposed in the at least one integrated circuit responsive to the magnitude of the alternating signal reaching a first predetermined value for establishing a voltage thereacross which remains substantially constant as the magnitude of the alternating signal exceeds said first predetermined value, said first electron control means having first, second and control electrodes;

circuit means for coupling said first electrode of said first electron control means to the input of the at least one integrated circuit; and second electron control means disposed in the at least one integrated circuit responsive to the magnitude of the alternating signal reaching a second predetermined value for establishing a voltage thereacross which remains substantially constant as the magnitude of the alternating signal exceeds said second predetermined value, said second electron control means having first, second and control electrodes, said control electrode of said second electron control means being connected to said control electrode of said first electron control means, said first electrode of said second electron control means being connected to the substrate region of the at least one integrated circuit, said second electrode of said second electron control means being connected to said second electrode of said first electron control means and to said substrate region.

5. The system of claim 4 wherein:

said first electron control means includes; a bipolar transistor with said second electrode being a collector-epi region disposed in said substrate region, said control electrode being a base region disposed in said collector-epi region and said first electrode being an emitter region disposed in said base region; and said second electron control means includes: a bipolar transistor with said second region being a collector-epi region disposed in said substrate region, said control electrode being a base region disposed in said collector region of said second electron control means and said first electrode being an emitter region disposed in said base region of said second electron control means.

* * * * *